(12) United States Patent
Sahmuganathan et al.

(10) Patent No.: US 12,037,679 B2
(45) Date of Patent: Jul. 16, 2024

(54) METHOD OF FORMING A DIAMOND FILM

(71) Applicants: Applied Materials, Inc., Santa Clara, CA (US); National University of Singapore, Singapore (SG)

(72) Inventors: Vicknesh Sahmuganathan, Singapore (SG); Jiteng Gu, Singapore (SG); Zhongxin Chen, Singapore (SG); Kian Ping Loh, Singapore (SG); John Sudijono, Singapore (SG); Haisen Xu, Guangdong Province (CN); Sze Chieh Tan, Singapore (SG); Yuanxing Han, Singapore (SG); Jiecong Tang, Singapore (SG); Eswaranand Venkatasubramanian, Santa Clara, CA (US); Abhijit Basu Mallick, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 301 days.

(21) Appl. No.: 17/633,010

(22) PCT Filed: Dec. 15, 2021

(86) PCT No.: PCT/US2021/063483
§ 371 (c)(1),
(2) Date: Feb. 4, 2022

(87) PCT Pub. No.: WO2022/132879
PCT Pub. Date: Jun. 23, 2022

(65) Prior Publication Data
US 2023/0279540 A1    Sep. 7, 2023

Related U.S. Application Data

(60) Provisional application No. 63/127,250, filed on Dec. 18, 2020.

(51) Int. Cl.
*C23C 16/27* (2006.01)
*C01B 32/26* (2017.01)
(Continued)

(52) U.S. Cl.
CPC ............ *C23C 16/274* (2013.01); *C01B 32/26* (2017.08); *C08F 2/48* (2013.01); *C23C 16/0272* (2013.01); *C23C 16/042* (2013.01); *C23C 16/511* (2013.01)

(58) Field of Classification Search
CPC ..... C23C 16/27; C23C 16/274; C23C 16/272; C23C 16/0272; C23C 16/042; C23C 16/511; C01B 32/25; C01B 32/26
See application file for complete search history.

(56) References Cited

U.S. PATENT DOCUMENTS 7,306,674 B2    12/2007   Dahl et al.
7,309,476 B2    12/2007   Carlson et al.
(Continued)

FOREIGN PATENT DOCUMENTS

| JP | 2008078470 A | 4/2008 |
|----|--------------|--------|
| JP | 2008085062 A | 4/2008 |
| WO | 2007111967 A2 | 10/2007 |

OTHER PUBLICATIONS

Spohn, Matthias, et al "Poly(1-vinyladamantane) as a Template for Nanodiamond Synthesis", ACS Appl. Nano Mater. 2018, 1, 6073-6080. (Year: 2018).*
(Continued)

*Primary Examiner* — Michael P Wieczorek
(74) *Attorney, Agent, or Firm* — Servilia Whitney LLC

(57) ABSTRACT

Apparatuses and methods for forming a film on a substrate are described. The film is formed on the substrate by depositing an adamantane monomer and an initiator on the
(Continued)

substrate to form a polymerizable seed layer and curing the polymerizable seed layer to form a polyadamantane layer.

17 Claims, 2 Drawing Sheets

(51) Int. Cl.
*C08F 2/48* (2006.01)
*C23C 16/02* (2006.01)
*C23C 16/04* (2006.01)
*C23C 16/511* (2006.01)

(56) References Cited

U.S. PATENT DOCUMENTS

| | | | |
|---|---|---|---|
| 7,795,468 B2 | 9/2010 | Liu et al. | |
| 8,105,660 B2 | 1/2012 | Tudhope et al. | |
| 8,420,768 B2 | 4/2013 | Dahl | |
| 9,034,561 B2 * | 5/2015 | Lee | G03F 7/033 430/285.1 |
| 2007/0251446 A1 * | 11/2007 | Dahl | C30B 29/04 117/104 |
| 2008/0076850 A1 | 3/2008 | Asano | |
| 2010/0048757 A1 | 2/2010 | Okada et al. | |
| 2010/0266954 A1 * | 10/2010 | Ito | G03F 7/027 560/220 |
| 2019/0127846 A1 | 5/2019 | Tudhope et al. | |

OTHER PUBLICATIONS

Leroy, Eric, et al., "Chemical vapor deposition of diamond growth using a chemical precursor", Applied Physics Letters 73, 1050 (1998); doi: 10.1063/1.122081.

Mandal, Soumen, et al., "Chemical Nucleation of Diamond Films", ACS Appl. Mater. Interfaces, Just Accepted Manuscript • DOI: 10.1021/acsami.6b08286 • Publication Date (Web): Sep. 14, 2016.

Ree, Brian J., et al., "Nanoscale film morphology and property characteristics of dielectric polymers bearing monomeric and dimeric adamantane units", Polymer 169 (2019) 225-233.

Spohn, Matthias, et al., "Poly(1-vinyladamantane) as a Template for Nanodiamond Synthesis", ACS Appl. Nano Mater. 2018, 1, 6073-6080.

Sternschulte, H., et al., "Comparison of MWPCVD diamond growth at low and highprocess gas pressures", Diamond and Related Materials, vol. 15, Issues 4-8, Apr.-Aug. 2006, pp. 542-547.

Sultane, Prakash R., et al., "Stereoelectronically Directed Photodegradation of Poly(adamantyl Vinyl Ketone)", Macromol. Rapid Commun. 2019, 1900302.

Tiwari, Rajanish N., "Enhanced Nucleation and Growth of Diamond Film on Si by CVD Using a Chemical Precursor", J. Phys. Chem. C 2011, 115, 16063-16073.

Tsugawa, K., et al., "Nucleation Enhancement of Nanocrystalline Diamond Growth at Low Substrate Temperatures by Adamantane Seeding", J. Phys. Chem. C 2010, 114, 3822-3824.

Wang, Kemin, et al., "Photopolymerization of 1-Adamantyl Acrylate Pohotoinitiated by Free Radical Photoinitiators", Journal of Applied Polymer Science, vol. 123, 26-31 (2012).

PCT International Search Report and Written Opinion in PCT/US2021/063483 dated Apr. 12, 2022, 11 pages.

Chen, Y. C., et al., "Chemical vapor deposition of diamond on silicon substrates coated with adamantane in glycol chemical solutions", RSC advances, 2013, vol. 3, No. 5, pp. 1514-1518.

* cited by examiner

METHOD OF FORMING A DIAMOND FILM

CROSS-REFERENCE TO RELATED APPLICATIONS

This application is the National Stage entry of PCT/US2021/063483, filed on Dec. 15, 2021, which claims priority to U.S. Provisional Application Ser. No. 63/127,250, filed on Dec. 18, 2020, the disclosures of which are herein incorporated by reference in their entireties.

TECHNICAL FIELD

Embodiments of the present disclosure pertain to the field of electronic device manufacturing, and, in particular, to integrated circuit (IC) manufacturing. More particularly, embodiments of the disclosure provide methods of depositing diamond-like carbon hard mask films, which can be used for patterning applications.

BACKGROUND

Diamond is a material with high hardness, chemical inertness, high thermal conductivity, and good optical transparency, making it promising in microelectronic applications. The deposition of diamond is problematic because it requires high temperature chemical vapor deposition (CVD) using diluted methane as a carbon source at a temperature in a range of from 800° C. to 1000° C. The need for such high temperatures lies in the differences in surface energy between a diamond film and a substrate, and the low sticking coefficient of hydrocarbon radicals, resulting in poor nucleation density on blank substrates.

One way to overcome poor nucleation density issues is use of detonated nano-diamond powders (~5 nm in diameter) in seeding processes. Mechanical abrasive or ultrasonic solution seeding, however, leads to problems of contamination and damage to the substrate.

Another way to overcome poor nucleation density issue is use of adamantane. Adamantane films, however, suffer from film non-uniformity due to the meta-stability of the seeded layer in high vacuum and elevated temperature. Adamantane has a relatively high vapor pressure and can sublime in high vacuum, which requires a thicker seeding layer (e.g., 1 mm coating) and multi-step deposition (i.e., introducing an incubation step at low temperature to convert chemical precursors into nanodiamonds) to ensure good film continuity. Addressing these problems can involve complicated synthetic procedures to access special precursors, as well as wet-solution processes to dissolve chemical precursors and spin-coat onto the substrate. The aggressive conditions to modify the substrate by wet approaches also poses potential risks in the nanofabrication process for electronic devices.

There is a need, therefore, for improved processes for forming diamond films.

SUMMARY

One or more embodiments of the disclosure are directed to a method of forming a film. In one or more embodiments, the method comprises: depositing an adamantane monomer and an initiator on a substrate to form a polymerizable seed layer; and curing the polymerizable seed layer to form a polyadamantane layer.

Other embodiments of the disclosure are directed to a method of forming a diamond film. In one or more embodiments, a method of forming a diamond film comprises: thermally evaporating an adamantane monomer and an initiator onto a substrate to form a polymerizable seed layer, the initiator comprising one or more of a benzophenone, a thioxanthone, a benzoin ether, a benzyl ketal, a dialkoxyacetophenone, a hydroxyalkylphenone, an aminoalkylphenone, an acylphosphine oxide, and derivatives thereof, and the adamantane monomer having a structure selected from the group consisting of formula (I), (II), (III), and (IV),

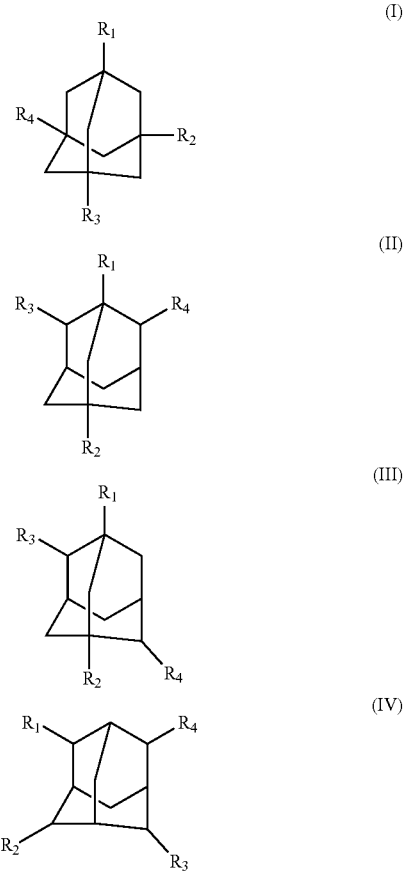

wherein $R_1$, $R_2$, $R_3$ and $R_4$ independently comprise one or more of hydrogen, a vinyl group, an acrylate group, a styrene group, an alkynyl group, a halide group, an epoxide group, an amine group, a carboxylic acid group, an ester group, and an alkyl group; exposing the polymerizable seed layer to a light source having a wavelength in a range of from 100 nm to 700 nm for a time period in a range of from 1 min to 2 hours to cure the polymerizable seed layer and form a polyadamantane layer on the substrate; removing an uncured portion of the polymerizable seed layer; and depositing a nano-crystalline diamond layer on the polyadamantane layer.

Further embodiments of the disclosure are directed to a method of forming a diamond film. In one or more embodiments, the method of forming a diamond film comprises exposing a substrate coated with a polyadamantane polymer to a plasma to form a nano-crystalline diamond layer on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "adamantane" includes adamantane, its substituents or higher analogues (oligo- or polyadamantanes). Adamantane is an organic compound with a formula $C_{10}H_{16}$ or, more descriptively, $(CH)_4(CH_2)_6$. Adamantane molecules can be described as the fusion of three cyclohexane rings. As the smallest "diamond" molecule, adamantane shares the same carbon atomic geometry as diamond with a 10-member carbon cage and 16 surrounding hydrogen atoms.

As used in this specification and the appended claims, the terms "precursor," "reactant," "reactive gas" and the like are used interchangeably to refer to any gaseous species that can react with the substrate surface.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

One or more embodiments of the disclosure advantageously provide a method to improve one or more of adamantane layer uniformity, nucleation density, and/or unwanted sublimation. In one or more embodiments, the method is a cleanroom-compatible dry-seeding process.

Figure 1:
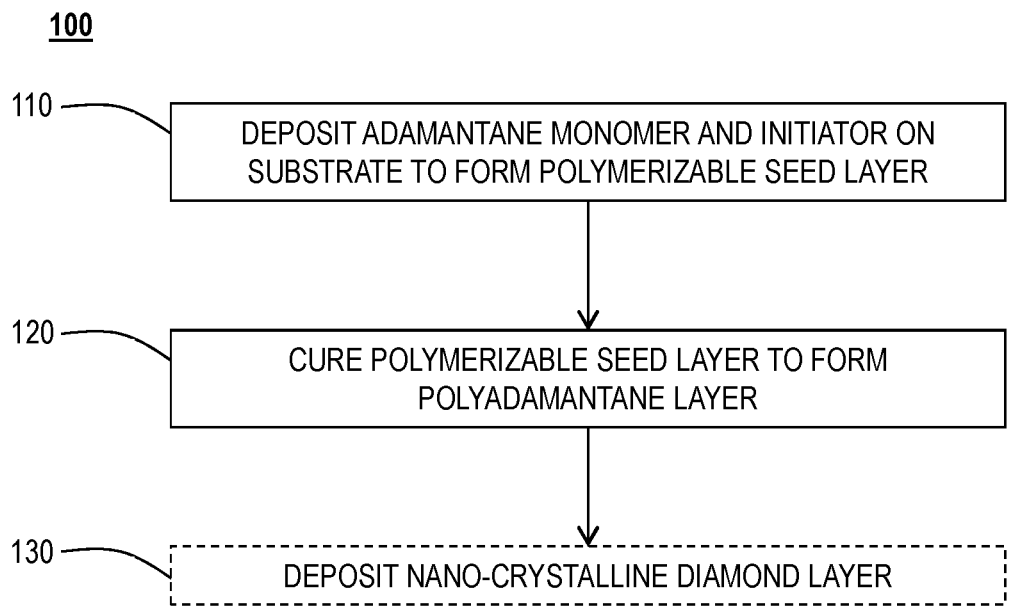
FIG. 1 illustrates a process flow diagram of a method for depositing an adamantane film according to one or more embodiments.
Figure 2:
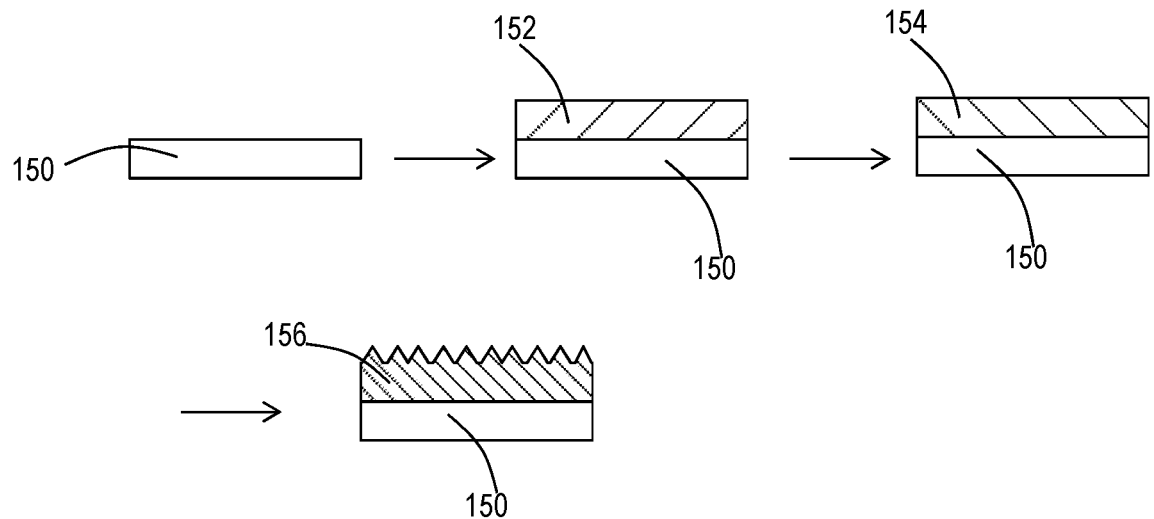
FIG. 2 illustrates a schematic cross-sectional view of a substrate according to one or more embodiments.

One or more embodiments of the disclosure are described with reference to the Figures. FIG. 1 illustrates a process flow diagram of a method 100 according to one or more embodiments. FIG. 2 illustrates a schematic cross-sectional view of a substrate 150 being processed according to the method of one or more embodiments. Referring to FIGS. 1 and 2, a method 100 of depositing a diamond film 156 is described. In some embodiments, the method 100 comprises at operation 110 depositing an adamantane monomer and an initiator on a substrate 150 (or substrate surface) to form a polymerizable seed layer 152, and at operation 120 curing the polymerizable seed layer 152 to form a polyadamantane layer 154.

As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the molybdenum-containing layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the polymerizable seed layer may be at least partially formed thereon. For example, in some embodiments, a layer comprising a metal, a nitride, an oxide, or the like, or combinations thereof may be disposed on the substrate and may have the polymerizable seed layer formed upon such layer or layers. In one or more embodiments, the substrate comprises silicon (Si) or poly-silicon (p-Si). In some embodiments, the substrate comprises a poly-Silicon substrate. In some embodiments, the substrate is chemically and/or physically unmodified.

In one or more embodiments, depositing the polymerizable seed layer 152 comprises one or more of thermal evaporation, spin-coating, or drop-casting. As used herein, the term "thermal evaporation" refers to a common method of physical vapor deposition (PVD) using a resistive heat source to evaporate a solid material in a vacuum environment to form a film. The adamantane monomer and the initiator are heated in a high vacuum chamber until vapor pressure is produced. The evaporated adamantane monomer and the initiator, or vapor stream, traverses the vacuum chamber with thermal energy and coats the substrate. As used herein, the term "spin-coat" or "spin-coating" refers to a procedure used to deposit uniform films onto substrates. Usually, a small amount of coating material is applied on the center of the substrate, which is either spinning at low speed or not spinning at all. The substrate is then rotated at speed up to 10,000 rpm to spread the coating material by centrifugal force. As used herein, the term "drop-cast" or "drop-casting" to a coating procedure where large droplets with controlled sizes and momentum are released that spread and wet the surface upon impact.

In one or more embodiments, depositing the polymerizable seed layer 152 comprises spin coating the initiator and the adamantane monomer onto the substrate 150. In some embodiments, the spin coated polymerizable seed layer 152 is heated at a temperature in a range of from 50° C. to 300°

C., from 50° C. to 200° C., from 50° C. to 100° C., from 75° C. to 300° C., from 75° C. to 200° C., or from 75° C. to 100° C. prior to curing.

In one or more embodiments, the method 100 is a chemical vapor deposition (CVD) process. In some embodiments, the chemical vapor deposition (CVD) comprises a thermal evaporation of the adamantane monomer and the initiator. In some embodiments, the adamantane monomer is highly volatile. In some embodiments, the term "highly volatile adamantane monomer" refers to an adamantane monomer having a vapor pressure in a range of from 0.05 mmHg to 5.0 mmHg, from 0.05 mmHg to 3.0 mmHg, 0.05 mmHg to 1.0 mmHg, from 0.1 mmHg to 5.0 mmHg, from 0.1 mmHg to 3.0 mmHg, from 0.1 mmHg to 1.0 mmHg, from 1.0 mmHg to 5.0 mmHg, or from 1.0 mmHg to 3.0 mmHg at 50° C.

In some embodiments, an adamantane monomer is a molecular seed for nucleation of a diamond film. In some embodiments, the adamantane monomer has a molecular size in a range of from 0.5 nm to 5 nm, from 0.5 nm to 2 nm, or from 0.5 nm to 1 nm. In some embodiments, adamantane has a molecular size of less than 1 nm, less than 2 nm, or less than 5 nm.

In some embodiments, the molecular seed is deposited by chemical nucleation. In some embodiments, the chemical nucleation results in an extremely high nucleation density. In some embodiments, the extremely high nucleation density refers to a density in a range of from $10^8$ cm$^{-2}$ to $10^{14}$ cm$^{-2}$, from $10^{10}$ cm$^{-2}$ to $10^{14}$ cm$^{-2}$, or from $10^{12}$ cm$^{-2}$ to $10^{14}$ cm$^{-2}$. In some embodiments, the extremely high nucleation density refers to a density of more than $10^8$ cm$^{-2}$, more than $10^{10}$ cm$^{-2}$ or more than $10^{12}$ cm$^{-2}$.

In one or more embodiments, the chemical nucleation is performed at a low temperature. In some embodiments, the low temperature refers to a temperature in a range of from room temperature to 300° C., from room temperature to 200° C., or from room temperature to 100° C. As used herein, the term "room temperature" refers to a temperature in a range of from 15° C. to 30° C.

In one or more embodiments, the adamantane monomer has a structure selected from the group consisting of formula (I), (II), (III), and (IV),

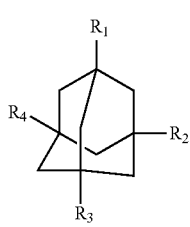

(I)

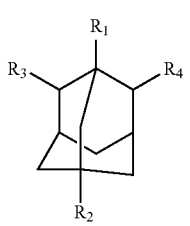

(II)

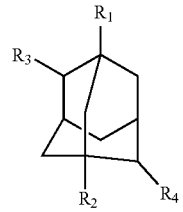

(III)

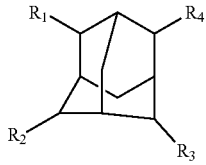

(IV)

wherein $R_1$, $R_2$, $R_3$ and $R_4$ independently comprise one or more of hydrogen, a vinyl group, an acrylate group, a styrene group, an alkynyl group, a halide group, an epoxide group, an amine group, a carboxylic acid group, an ester group, and an alkyl group.

Unless otherwise indicated, the term "lower alkyl," "alkyl," or "alk" as used herein alone or as part of another group includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. An alkynyl carbon is a carbon atom triply bonded to a carbon atom in an organic molecule As used herein, the term "amine" relates to any organic compound containing at least one basic nitrogen atom, e.g., NR'$_2$, wherein R' is independently selected from hydrogen (H) or alkyl.

As used herein, the terms "vinyl" or "vinyl-containing" refer to groups containing the vinyl group (—CH=CH$_2$).

As used herein, the term "epoxide" refers to a cyclic ether with a three-atom ring.

As used herein, the term "carboxylic acid" refers to an organic acid that contains a carboxyl group (C(=O)OH).

As used herein, the term "halide" refers to a binary phase, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F—), chloride (Cl—), bromide (Br—), iodide (I—), and astatide (At—).

As used herein, the term "ester" refers to a chemical compound derived from an acid (organic or inorganic) in which at least one —OH (hydroxyl) group is replaced by an —O-alkyl group.

As used herein, the term "acrylate" refers to salts, esters, and conjugate bases of acrylic acid. The acrylate ion is the anion CH$_2$=CHCOO$^-$.

In one or more embodiments, the adamantane monomer is selected from the group consisting of:

(Ia)
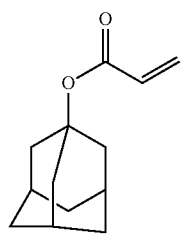
(Ib)
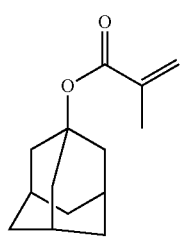
(Ic)
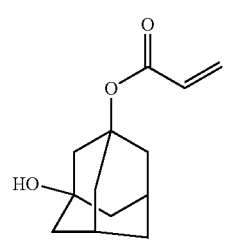
(Id)
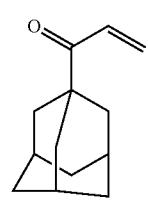
(Ie)
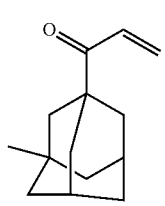
(If)
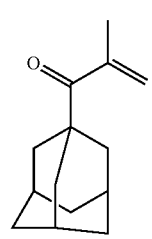
(Ig)
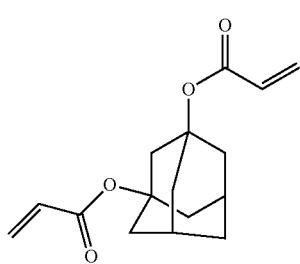
(Ih)
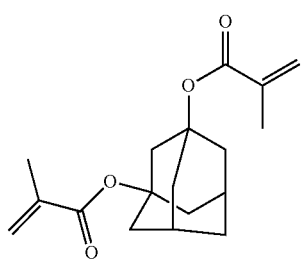
(Ii)
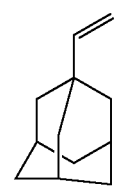
(Ij)
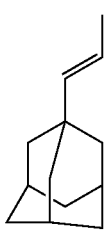
(Ik)
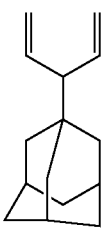
(Il)
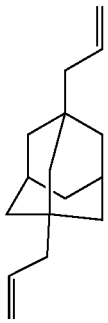
(Im)
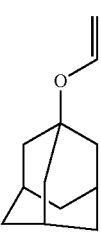

(In) 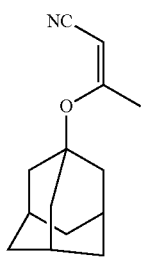

(Io) 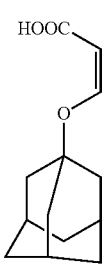

(Ip) 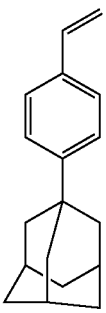

(Iq) 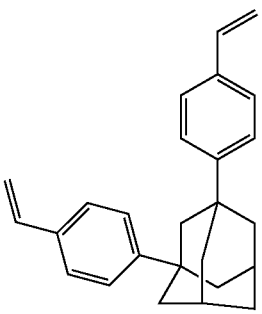

(Ir) 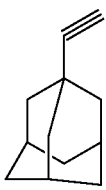

(Is) 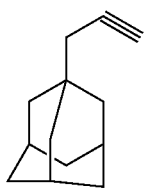

(It) 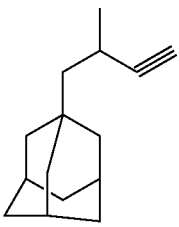

(Iu) 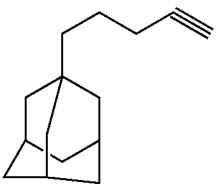

(Iv) 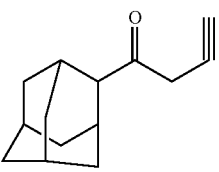

(Iw) 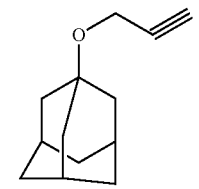

(Ix) 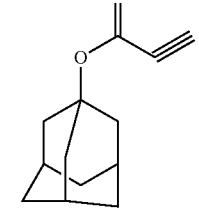

(Iy) 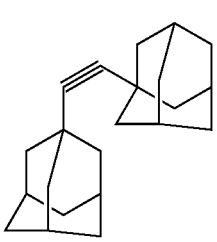

In one or more embodiments, the adamantane monomer has a molecular weight in a range of from 136 g/mol to 700 g/mol, from 136 g/mol to 600 g/mol, from 136 g/mol to 500 g/mol, from 136 g/mol to 400 g/mol, or from 136 g/mol to 300 g/mol.

In one or more embodiments, the adamantane monomer has a boiling point in a range of from 10° C. to 400° C., from 50° C. to 400° C., from 100° C. to 400° C., from 200° C. to 400° C., from 10° C. to 300° C. from 50° C. to 300° C., from 100° C. to 300° C. or from 200° C. to 300° C. In some embodiments, the adamantane monomer has a boiling point less or equal to 400° C., less or equal to 300° C., less or equal to 200° C., or less or equal to 100° C.

In one or more embodiments, the adamantane monomer has a sublimation point in a range of from 10° C. to 400° C., from 50° C. to 400° C., from 100° C. to 400° C., from 200° C. to 400° C., from 10° C. to 300° C., from 50° C. to 300° C., from 100° C. to 300° C. or from 200° C. to 300° C. In some embodiments, the adamantane monomer has a sublimation point less or equal to 400° C., less or equal to 300° C., less or equal to 200° C., or less or equal to 100° C.

In one or more embodiments, the adamantane monomer is thermally stable at a temperature in a range of from 10° C. to 400° C., from 50° C. to 400° C., from 100° C. to 400° C., from 200° C. to 400° C., from 10° C. to 300° C., from 50° C. to 300° C., from 100° C. to 300° C. or from 200° C. to 300° C. In some embodiment the adamantane monomer is thermally stable at a temperature less or equal to 400° C., less or equal to 300° C., less or equal to 200° C., or less or equal to 100° C.

In one or more embodiments, one or more of the boiling point, sublimation point, and/or thermal stability is determined by thermogravimetric analysis (TGA).

In more embodiments, the initiator comprises one or more of a benzophenone, a thioxanthone, a benzoin ether, a benzyl ketal, a dialkoxyacetophenone, a hydroxyalkylphenone, an aminoalkylphenone, and an acylphosphine oxide, and derivatives thereof.

In one or more embodiments, one or more of the adamantane monomer and/or the initiator has a vapor pressure in a range of from 0.05 mmHg to 5.0 mmHg, from 0.05 mmHg to 3.0 mmHg, 0.05 mmHg to 1.0 mmHg, from 0.1 mmHg to 5.0 mmHg, from 0.1 mmHg to 3.0 mmHg, from 0.1 mmHg to 1.0 mmHg, from 1.0 mmHg to 5.0 mmHg or from 1.0 mmHg to 3.0 mmHg at 50° C. In one or more embodiments, one or more of the adamantane monomer and/or the initiator has a boiling point in a range of from 25° C. to 400° C., from 25° C. to 300° C., from 25° C. to 200° C., from 25° C. to 100° C., from 50° C. to 400° C., from 50° C. to 300° C., from 50° C. to 200° C. from 50° C. to 100° C., from 100° C. to 400° C., from 100° C. to 300° C. or from 100° C. to 200° C. In one or more embodiments, one or more of the adamantane monomer and/or the initiator has a thermal stability in a range of from 25° C. to 400° C., from 25° C. to 300° C., from 25° C. to 200° C., from 25° C. to 100° C., from 50° C. to 400° C., from 50° C. to 300° C., from 50° C. to 200° C., from 50° C. to 100° C., from 100° C. to 400° C., from 100° C. to 300° C. or from 100° C. to 200° C.

In some embodiments, the method 100 provides covalent bonding between the one or more adamantane monomers and the substrate, e.g., silicon (Si) wafer or poly-silicon wafer.

In some embodiments, depositing the adamantane monomer and the initiator on the substrate to form the polymerizable seed layer 152 comprises a thermal evaporation of the adamantane monomer and the initiator.

In one or more embodiments, the adamantane monomer and the initiator are thermally evaporated in a ratio of from 0.01 wt. % to 20 wt. %, from 0.05 wt. % to 20 wt. %, from 0.1 wt. % to 20 wt. %, from 0.5 wt. % to 20 wt. %, from 1 wt. % to 20 wt. %, from 0.01 wt. % to 15 wt. %, from 0.05 wt. % to 15 wt. %, from 0.1 wt. % to 15 wt. %, from 0.5 wt. % to 15 wt. %, from 1 wt. % to 15 wt. %, from 0.01 wt. % to 10 wt. %, from 0.05 wt. % to 10 wt. %, from 0.1 wt. % to 10 wt. %, from 0.5 wt. % to 10 wt. %, from 1 wt. % to 10 wt. %, from 0.01 wt. % to 5 wt. %, from 0.05 wt. % to 5 wt. %, from 0.1 wt. % to 5 wt. %, from 0.5 wt. % to 5 wt. % or from 1 wt. % to 5 wt. %.

In one or more embodiments, the polymerizable seed layer 152 is relatively uniform. In some embodiments, the term "relatively uniform" refers to a polymerizable seed layer having a roughness less than 2 nm, less than 1 nm, or less than 0.5 nm. In one or more embodiments, the roughness can be measured by atomic force microscopy (AFM).

In some embodiments, the polymerizable seed layer 152 has a thickness in a range of from 10 nm to 2000 nm, from 100 nm to 2000 nm, from 500 nm to 2000 nm, from 1000 nm to 2000 nm, from 10 nm to 1000 nm, from 100 nm to 1000 nm or from 500 nm to 1000 nm.

In one or more embodiments, curing the polymerizable seed layer 152 to form the polyadamantane layer 154 comprises one or more of a thermal treatment or a UV treatment.

In one or more embodiments, curing the polymerizable seed layer 152 comprises exposing the polymerizable seed layer 152 to a light source having a wavelength in a range of from 100 nm to 700 nm, from 100 nm to 600 nm, from 100 nm to 500 nm, from 100 nm to 400 nm, from 100 nm to 300 nm, from 100 nm to 200 nm, from 200 nm to 700 nm, from 300 nm to 700 nm, from 400 nm to 700 nm, from 500 nm to 700 nm, from 600 nm to 700 nm, from 200 nm to 600 nm, from 200 nm to 500 nm, from 200 nm to 400 nm or from 200 nm to 300 nm.

In one or more embodiments, the polymerizable seed layer 152 is exposed to the light source for a time period in a range of from 1 min to 3 hours, from 1 min to 2.5 hours, from 1 min to 2 hours, from 1 min to 1.5 hours, from 1 min to 1 hours, from 1 min to 50 min, from 1 min to 40 min, from 1 min to 30 min, from 1 min to 20 min or from 1 min to 10 min.

The method of one or more embodiments advantageously improves the thermal stability of the polymeric seeds. In some embodiments, the thermal stability is in a range of from 300° C. to 700° C., including from 400° C. to 700° C., from 500° C. to 700° C., or from 600° C. to 700° C. In some embodiments, the method advantageously reduces evaporation of adamantane polymeric seeds. In some embodiments, the evaporation is in a range of from 300° C. to 700° C. from 400° C. to 700° C., from 500° C. to 700° C. or from 600° C. to 700° C.

In one or more embodiments, the polyadamantane layer 154 is relatively uniform. In some embodiments, the term "relatively uniform" refers to a polyadamantane layer 154 having a roughness less than 2 nm, less than 1 nm, or less than 0.5 nm. In one or more embodiments, the roughness can be measured by atomic force microscopy (AFM).

In some embodiments, the polyadamantane layer 154 has a thickness in a range of from 10 nm to 2000 nm, from 100 nm to 2000 nm, from 500 nm to 2000 nm, from 1000 nm to 2000 nm, from 10 nm to 1000 nm, from 100 nm to 1000 nm or from 500 nm to 1000 nm.

In one or more embodiments, the polyadamantane layer 154 is thermally stable at a temperature in a range of from 300° C. to 700° C., from 400° C. to 700° C., from 500° C. to 700° C. or from 600° C. to 700° C. In some embodiment, the polyadamantane layer is thermally stable at a temperature less than 700° C., less than 600° C., less than 500° C. or less than 400° C.

In one or more embodiments, the polyadamantane layer 154 comprises one or more polymerized molecules. In one or more embodiments, the polyadamantane layer 154 is substantially free of adamantane monomer. As used herein, the term "substantially free" means that there is less than about 5%, including less than about 4%, less than about 3%, less than about 2%, less than about 1%, and less than about 0.5% of the adamantane monomer, on an atomic basis, in the poly adamantane layer.

In one or more embodiments, the one or more polymerized molecules have a molecular weight in range of from 500 g/mol to 100,000 g/mol from 1000 g/mol to 70,000 g/mol, from 1000 g/mol to 60,000 g/mol, from 1000 g/mol to 50,000 g/mol, from 1000 g/mol to 4000.0 g/mol, from 1000 g/mol to 30,000 g/mol, from 2000 g/mol to 70,000 g/mol, from 2000 g/mol to 60,000 g/mol, from 2000 g/mol to 50,000 g/mol, from 2000 g/mol to 40,000 g/mol or from 2000 g/mol to 30,000 g/mol.

In one or more embodiments, the one or more polymerized molecules are thermally stable at a temperature in a range of from 300° C. to 700° C., from 400° C. to 700° C., from 500° C. to 700° C. or from 600° C. to 700° C. In some embodiment the one or more polymerized molecules is thermally stable at a temperature less than 700° C., less than 600° C. less than 500° C. or less than 400° C.

In one or more embodiments, the one or more polymerized molecules comprise from 2 to 500 repeating adamantane monomers, from 2 to 300 repeating adamantane monomers, from 2 to 100 repeating adamantane monomers, from 5 to 500 repeating adamantane monomers, from 5 to 300 repeating adamantane monomers or from 5 to 100 repeating adamantane monomers.

In one or more embodiments, the one or more polymerized molecules are formed by copolymerizing a mixture comprising the adamantane monomer and one or more polymerizable units selected from the group consisting of a random co-polymer, a block co-polymer, a grafted co-polymer, and a branched co-polymer.

In one or more embodiments, a substrate is coated with a polyadamantane film, and the polyadamantane film is exposed to a plasma to form a nano-crystalline diamond layer on the substrate. The plasma may be a high density plasma having a density of greater than or equal to 2.3E11 cm$^{-3}$. In one or more embodiments, an adamantane monomer is dissolved in a solvent forming a solution of the adamantane monomer. The adamantane monomer may be any of the monomers described herein. In one or more embodiments, an initiator is added to the solution of the adamnatane monomer. The initiator may comprise any of the initiator described herein. The mixture of the adamantane monomer and the initiator is then exposed to ultraviolet light to provide a polyadamantane polymer. In one or more embodiments, the polyadamantane polymer is dissolved in a solvent to form a polymer solution. The polymer solution can be filtered to remove particles that are too large, removing, for example, particles in a range of from 0.2 μm to 10 μm. The polymer solution is then spin coated onto a substrate. Spin coating can be done at any suitable speed. In one or more embodiments, the spin coating is conducted at a speed in a range of from 100 rpm to 1000 rpm, or in a range of from 300 rpm to 500 rpm to achieve a uniform polyadamantane film. The polyadamantane film may have a thickness in a range of from 10 nm to 1000 nm, or in a range of from 100 nm to 300 nm. The substrate coated with the polyadamantane film is then exposed to a plasma to form a nano-crystalline diamond layer on the substrate.

In one or more embodiments, the method 100 further comprises, prior to curing, forming a mask layer on the polymerizable seed layer 152.

In one or more embodiments, the method 100 further comprises removing an uncured portion of the polymerizable seed layer 152.

In one or more embodiments, removing the uncured portion comprises heating the substrate at a temperature in a range of from 10° C. to 400° C. including from 10° C. to 350° C., from 10° C. to 300° C., from 20° C. to 400° C., from 20° C. to 350° C., from 20° C. to 300° C., from 30° C. to 400° C., from 30° C. to 350° C., from 30° C. to 300° C., from 40° C. to 400° C., from 40° C. to 350° C., from 40° C. to 300° C., from 50° C. to 400° C., from 50° C. to 350° C., from 50° C. to 300° C., from 60° C. to 400° C., from 60° C. to 350° C. or from 60° C. to 300° C. In one or more embodiments, removing the uncured portion comprises chemically treating the substrate. In some embodiments, chemically treating comprises chemically washing. In one or more embodiments, chemical washing is performed using solvents such as isopropyl alcohol (IPA) and acetone, where the solvent removes the uncured portion by dissolving the monomer while retaining the cured portion (polymer) intact.

In one or more embodiments, the method 100 further comprises at operation 130 depositing a nano-crystalline diamond layer 156 on the polyadamantane layer 154.

In one or more embodiments, depositing the nano-crystalline diamond layer comprises one or more of atomic layer deposition (ALD), physical vapor deposition (PVD), chemical vapor deposition (CVD), microwave chemical vapor deposition (MWCVD), microwave plasma chemical vapor deposition (MWPCVD), plasma enhanced atomic layer deposition (PEALD), and plasma enhanced chemical vapor deposition (PECVD).

In one or more embodiments, the method comprises growing an ultrathin diamond film. In some embodiments, the ultrathin diamond film is grown by a low-temperature chemical vapor deposition (CVD) process.

Figure 3:
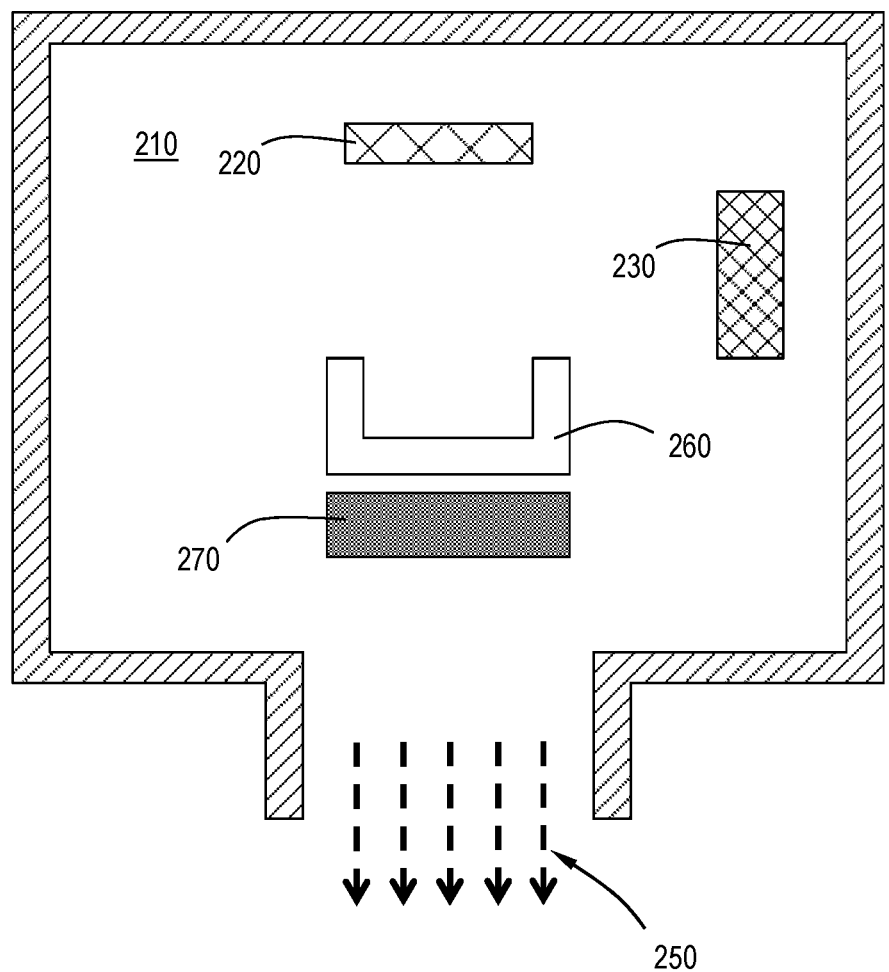
FIG. 3 illustrates a schematic cross-sectional view of an adamantane deposition chamber.

FIG. 3 illustrates a schematic cross-sectional view of a deposition assembly 200. The assembly 200 comprises a deposition chamber 210. In some embodiments, the chamber 210 comprises a substrate support 220, a first heating source 230, and an outlet 250.

In one or more embodiments, the chamber 210 is configured to perform one or more of atomic layer deposition (ALD), physical vapor deposition (PVD), chemical vapor deposition (CVD), microwave chemical vapor deposition (MWCVD), microwave plasma chemical vapor deposition (MWPCVD), plasma enhanced atomic layer deposition (PEALD), and plasma enhanced chemical vapor deposition (PECVD).

In some embodiments, the outlet 250 is connected to a vacuum source. In some embodiments, the vacuum source is configured to apply a pressure in a range of from 0.01 mbar to 0.5 mbar, from 0.01 mbar to 0.3 mbar, from 0.01 mbar to 0.1 mbar, from 0.1 mbar to 0.5 mbar or from 0.1 mbar to 0.3 mbar.

In some embodiments, the first heating source 230 is configured to heat the polymerizable seed layer. In some embodiments, the first heating source 230 is configured to heat the polymerizable seed layer at a temperature in a range of from 25° C. to 700° C., 25° C. to 500° C., from 25° C. to 300° C., from 50° C. to 700° C., from 50° C. to 500° C. from 50° C. to 300° C., 100° C. to 700° C., from 100° C. to 500° C. or from 100° C. to 300° C.

In some embodiments, the first heating source 230 is configured to heat the polyadamantane layer. In some embodiments, the first heating source 230 is configured to heat the polyadamantane layer at a temperature in a range of from 50° C. to 600° C., 50° C. to 500° C., from 50° C. to 400° C., from 50° C. to 300° C. or from 50° C. to 200° C.

In one or more embodiments, the chamber 210 further comprises a crucible 260 and a second heating source 270 in contact with the crucible 260.

In some embodiments, the second heating source 270 is configured to heat the crucible 260. In some embodiments, the second heating source 270 is configured to heat the crucible 260 at a temperature in a range of from 25° C. to 400° C., from 25° C. to 300° C., from 25° C. to 200° C., from 25° C. to 100° C., from 50° C. to 400° C., from 50° C. to 300° C., from 50° C. to 200° C., from 50° C. to 100° C., from 100° C. to 400° C., from 100° C. to 300° C. or from 100° C. to 200° C.

In some embodiments, the crucible 260 has one or more crucible inlets. The one or more crucible inlets are connected to one or more an adamantane reservoir and/or an initiator reservoir. In some embodiments, the one or more crucible inlet comprises one or more programmable valves. The one or more programmable valve dispenses a predetermined quantity of the adamantane and/or the initiator into the crucible 260.

In some embodiments, a controller may be provided and coupled to various components of the deposition assembly 200 to control the operation thereof. The controller can be a single controller that controls the entire deposition assembly 200, or multiple controllers that control individual portions of the deposition assembly 200. In some embodiments, the controller includes a central processing unit (CPU), support circuits, memory, and an input/output (I/O). The controller may control the deposition assembly 200 directly, or via computers (or controllers) associated with particular process chamber and/or support system components. The controller may be one of any form of general-purpose computer processor that can be used in an industrial setting for controlling various chambers and sub-processors. The memory or computer readable medium of the controller may be one or more of readily available memory such as random-access memory (RAM), read only memory (ROM), floppy disk, hard disk, optical storage media (e.g., compact disc or digital video disc), flash drive, or any other form of digital storage, local or remote. The support circuits are coupled to the CPU for supporting the processor in a conventional manner. These circuits include cache, power supplies, clock circuits, input/output circuitry and subsystems, and the like. One or more processes may be stored in the memory as software routine that may be executed or invoked to control the operation of the deposition assembly 200 or individual components in the manner described herein. The software routine may also be stored and/or executed by a second CPU that is remotely located from the hardware being controlled by the CPU. The input/output can include keyboards, computer mice, displays and/or printers.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Adamantane monomer was dissolved in a suitable solvent. An initiator was then added into the solution. The mixture was exposed to a UV lamp for a time period in a range of from 1 min to 60 hours, depending upon the required extent of polymerization. The product was obtained and purified in an appropriate solvent. The final product was oven-dried for more than 10 hours. To coat the polymer onto silicon, the as-synthesized polyadamantane was dissolved into suitable solvents by heating.

These solvents may include tetrahydrofuran, decalin, and anisole, and the temperature ranges varied from 50° C. to 200° C. The polymer solution was filtered through a syringe filter with a suitable membrane, removing particles of size ranging between 0.2 to about 10 μm. The filtered solution was coated onto the substrate using a spin coater at a spin speed of 100 to about 1000 rpm to achieve a uniform polyadamantane film in the thickness range of 10 nm to 1000 nm.

The polyadamantane coated substrates were loaded into the microwave chemical vapor deposition (MW CVD) chamber and subjected to various plasma conditions for conversion into diamond particles. A less dense plasma ($<2.3E11$ $cm^{-3}$) was ignited using $CH_4/CO_2/H_2$ gases with the microwave power of 2-12 kw at 10-90% duty cycle and 35-350 Hz. After 0.5 hour to 4 hours of treatment in the less dense plasma, a more dense plasma ($>2.3E11$ $cm^{-3}$) produced at 2 KW to 12 KW microwave power was used for diamond nuclei growth. Finally, the diamond particle density was analyzed depending on the SEM images by Image J software. To validate the effectiveness of the optimized plasma in enhancing particle density, UNCD film was deposited at a temperature in a range of from 400 to 800° C. in $CH_4/CO_2/H_2/Ar$ gases.

After 0.5 hour to 4 hours of treatment in a less dense plasma, many irregular nanoparticles (white spots) formed, indicating the transformation of polyadamantane into diamond nuclei. These small diamond nuclei grow large, together with the occurrence of new diamond nuclei, demonstrated by the increasing and enlarging white spots. The average size of white spots is approximately in the order of hundred nanometers. A high density of diamond nuclei was achieved by altering the plasma chemistry in the less dense plasma condition. A sharp diamond peak at 1332 $cm^{-2}$ in the Raman spectrum reveals its high quality. To confirm the validity of the plasma in enhancing diamond nuclei density, UNCD film was deposited. A continuous UNCD film was grown with root mean square roughness of 8.3 nm. Raman spectrum shows a typical diamond peak at around 1332 $cm^{-2}$.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments." "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a film, the method comprising:
depositing an adamantane monomer and an initiator on a substrate to form a polymerizable seed layer;
curing the polymerizable seed layer to form a polyadamantane layer;
removing an uncured portion of the polymerizable seed layer by heating the substrate at a temperature in a range of from 25° C. to 400° C. or chemically washing the substrate; and
depositing a nano-crystalline diamond layer on the polyadamantane layer.

2. The method of claim 1, wherein depositing the polymerizable seed layer comprises one or more of thermal evaporation, spin-coating, or drop-casting.

3. The method of claim 2, wherein depositing the polymerizable seed layer comprises spin coating the initiator and the adamantane monomer onto the substrate and heating the polymerizable seed layer at a temperature in a range of from 25° C. to 400° C. prior to curing.

4. The method of claim 2, wherein depositing the polymerizable seed layer comprises exposing a mixture of the adamantane monomer and the initiator to ultraviolet light to provide the polyadamantane seed layer.

5. The method of claim 1, wherein the initiator comprises one or more of a benzophenone, a thioxanthone, a benzoin ether, a benzyl ketal, a dialkoxyacetophenone, a hydroxyalkylphenone, an aminoalkylphenone, and an acylphosphine oxide, and derivatives thereof.

6. The method of claim 1, wherein the adamantane monomer has a structure selected from the group consisting of formula (I), (II), (III), and (IV),

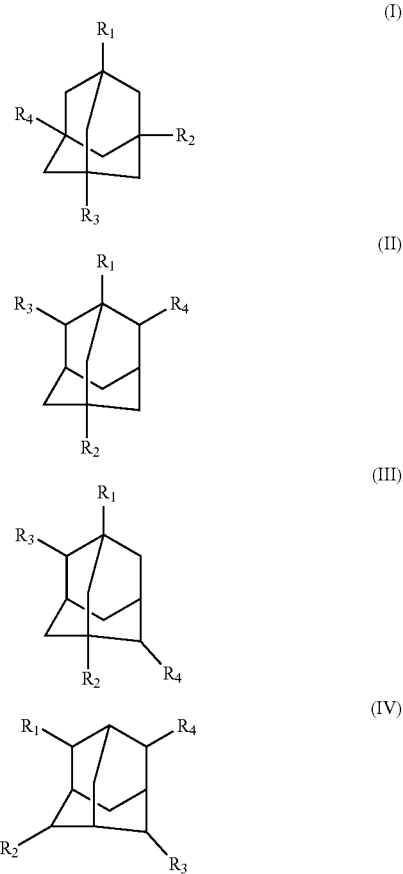

wherein $R_1$, $R_2$, $R_3$ and $R_4$ independently comprise one or more of hydrogen, a vinyl group, an acrylate group, a styrene group, an alkynyl group, a halide group, an epoxide group, an amine group, a carboxylic acid group, an ester group, and an alkyl group.

7. The method of claim 1, wherein curing the polymerizable seed layer comprises exposing the polymerizable seed layer to a light source having a wavelength in a range of from 100 nm to 700 nm.

8. The method of claim 7, wherein the polymerizable seed layer is exposed to the light source for a time period in a range of from 1 min to 2 hours.

9. The method of claim 1, wherein the polyadamantane layer comprises one or more polymerized molecules.

10. The method of claim 9, wherein the one or more polymerized molecules has a molecular weight in range of from 500 g/mol to 60,000 g/mol.

11. The method of claim 9, wherein the one or more polymerized molecules comprises from 5 to 500 repeating adamantane monomers.

12. The method of claim 9, wherein the one or more polymerized molecules are formed by copolymerizing a mixture comprising the adamantane monomer and one or more polymerizable units selected from the group consisting of a random co-polymer, a block co-polymer, a grafted co-polymer, and a branched co-polymer.

13. The method of claim 1, further comprising, prior to curing, forming a mask layer on the polymerizable seed layer.

14. The method of claim 1, wherein depositing the nano-crystalline diamond layer comprises one or more of atomic layer deposition (ALD), physical vapor deposition (PVD), chemical vapor deposition (CVD), microwave chemical vapor deposition (MWCVD), microwave plasma chemical vapor deposition (MWPCVD), plasma enhanced atomic layer deposition (PEALD), and plasma enhanced chemical vapor deposition (PECVD).

15. A method of forming a diamond film, the method comprising:

thermally evaporating an adamantane monomer and an initiator onto a substrate to form a polymerizable seed layer, the initiator comprising one or more of a benzophenone, a thioxanthone, a benzoin ether, a benzyl ketal, a dialkoxyacetophenone, a hydroxyalkylphenone, an aminoalkylphenone, an acylphosphine oxide, and derivatives thereof, and the adamantane monomer having a structure selected from the group consisting of formula (I), (II), (III), and (IV),

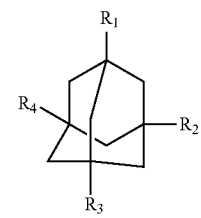
(I)

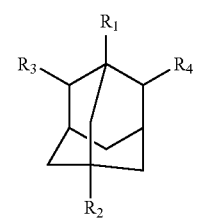
(II)

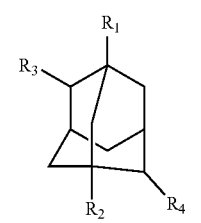
(III)

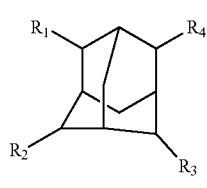
(IV)

wherein $R_1$, $R_2$, $R_3$ and $R_4$ independently comprise one or more of hydrogen, a vinyl group, an acrylate group, a styrene group, an alkynyl group, a halide group, an epoxide group, an amine group, a carboxylic acid group, an ester group, and an alkyl group;

exposing the polymerizable seed layer to a light source having a wavelength in a range of from 100 nm to 700 nm for a time period in a range of from 1 min to 2 hours to cure the polymerizable seed layer and form a polyadamantane layer on the substrate;

removing an uncured portion of the polymerizable seed layer; and depositing a nano-crystalline diamond layer on the polyadamantane layer.

16. The method of claim 15, wherein the adamantane monomer is selected from the group consisting of:

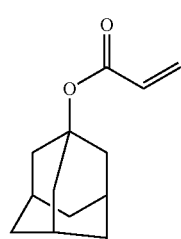
(Ia)

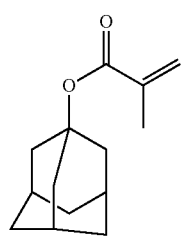
(Ib)

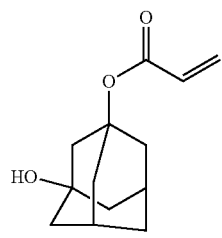
(Ic)

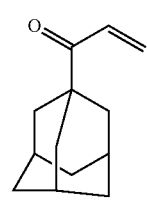
(Id)

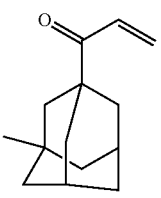
(Ie)

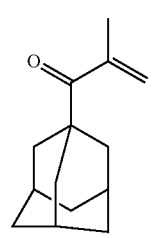
(If)

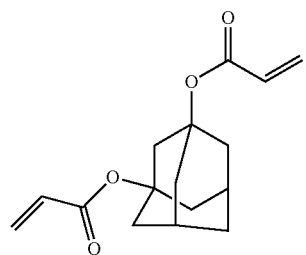
(Ig)
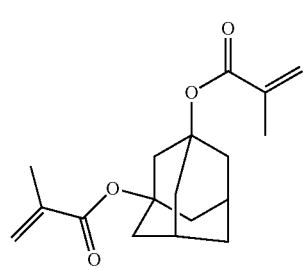
(Ih)
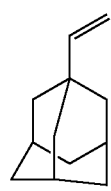
(Ii)
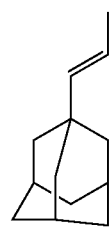
(Ij)
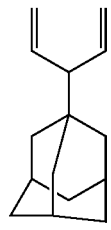
(Ik)
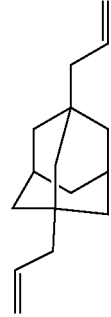
(Il)
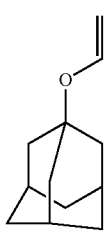
(Im)
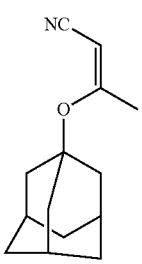
(In)
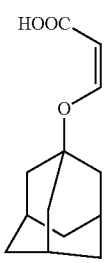
(Io)
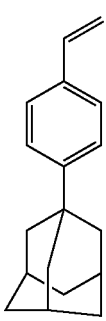
(Ip)
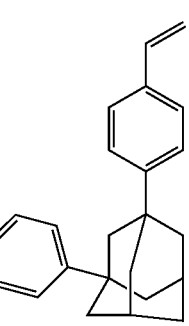
(Iq)
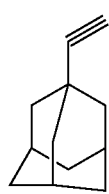
(Ir)

-continued

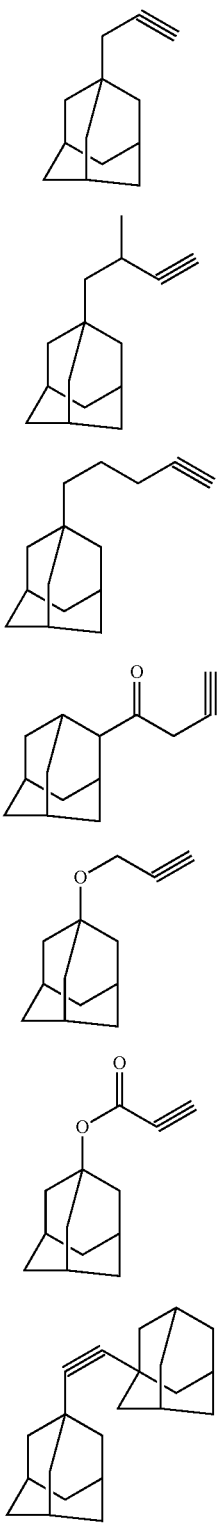

(Is)
(It)
(Iu)
(Iv)
(Iw)
(Ix)
(Iy)

17. A method of forming a diamond film, the method comprising:

dissolving an adamantane monomer in a first solvent to form a solution, the adamantane monomer having a structure selected from the group consisting of formula (I), (II), (III), and (IV)

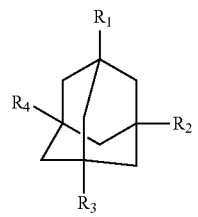

(I)

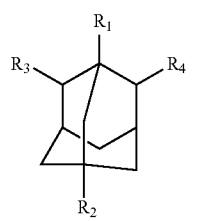

(II)

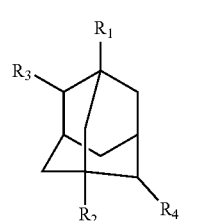

(III)

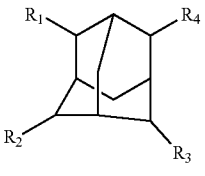

(IV)

wherein $R_1$, $R_2$, $R_3$ and $R_4$ independently comprise one or more of hydrogen, a vinyl group, an acrylate group, a styrene group, an alkynyl group, a halide group, an epoxide group, an amine group, a carboxylic acid group, an ester group, and an alkyl group;

adding an initiator to the solution to form a mixture, the initiator comprising one or more of a benzophenone, a thioxanthone, a benzoin ether, a benzyl ketal, a dialkoxyacetophenone, a hydroxyalkylphenone, an aminoalkylphenone, an acylphosphine oxide, and derivatives thereof;

exposing the mixture to ultraviolet light to provide the polyadamantane polymer;

dissolving the polyadamantane polymer in a second solvent to form a polymer solution;

spin coating the polymer solution onto the substrate to coat the substrate with the polyadamantane polymer; and exposing the substrate coated with the polyadamantane polymer to a plasma to form a nano-crystalline diamond layer on the substrate.

* * * * *